United States Patent [19]
Morgan et al.

[11] Patent Number: 5,936,479
[45] Date of Patent: Aug. 10, 1999

[54] SUPPLY VOLTAGE INSENSITIVE CHARGE/ DISCHARGE TYPE OSCILLATOR AND METHOD

[75] Inventors: Donald M. Morgan, Boise, Id.; Steven F. Schicht, Austin, Tex.

[73] Assignee: Micron Technology, Inc., Boise, Id.

[21] Appl. No.: 08/998,129

[22] Filed: Dec. 24, 1997

[51] Int. Cl.[6] .............................. H03K 3/03; H03K 3/354
[52] U.S. Cl. .......................... 331/111; 331/143; 331/175; 365/222
[58] Field of Search .................................. 331/111, 143, 331/175; 365/222

[56] References Cited

U.S. PATENT DOCUMENTS 5,070,311  12/1991  Nicolai ..................................... 331/111
5,668,508   9/1997  Pulvirenti et al. ....................... 331/111

Primary Examiner—Siegfried H. Grimm
Attorney, Agent, or Firm—Seed and Berry LLP

[57] ABSTRACT

An oscillator circuit is described which produces a periodic oscillator output signal. The frequency of the oscillator output signal is essentially independent of the supply voltage provided to the oscillator circuit. The oscillator circuit includes a capacitor which is periodically charged and discharged. A high trip point inverter and a low trip point inverter detect the voltage level of the capacitor and set and reset, respectively, a flip-flop. The flip-flop produces an output signal which controls the charge and discharge of the capacitor through charging and discharging circuit paths, respectively. The impedance presented by the charging and discharging circuit paths varies as a function of the supply voltage, such that the high and low trip point inverters are switched at a frequency which is essentially independent of the supply voltage magnitude. The oscillator output signal is derived from the flip-flop output signal.

7 Claims, 3 Drawing Sheets

5,936,479

SUPPLY VOLTAGE INSENSITIVE CHARGE/ DISCHARGE TYPE OSCILLATOR AND METHOD

TECHNICAL FIELD

This invention relates generally to oscillator circuits, and more particularly, to oscillator circuits which produce output signals having a frequency which is relatively independent of the supply voltage value.

BACKGROUND OF THE INVENTION

When designing electronic systems, signals are often required which have certain prescribed waveforms, such as sinusoidal, square, triangular, etc. Electronic systems in which such signals are required include: computer and control systems in which clock pulses are used for timing purposes; communication systems in which a variety of waveforms are used as information carriers; and test and measurement systems in which a variety of waveforms are used for testing and characterizing electronic devices and circuits. A large number of well-known circuits are used for generating such signals, and are generally known as oscillators.

In many applications, it is desirable to provide a signal with a frequency that is independent of variations in supply voltage. Conventional supply voltage insensitive oscillators typically employ one or more of a variety of well-known voltage regulation circuits in order to provide the oscillator with a regulated voltage, which is relatively independent of the supply voltage. Alternatively, supply-insensitive current sources are used to drive the oscillator with a relatively constant current, independent of variations in the supply voltage.

One particularly important application of supply voltage insensitive oscillators is for self-refresh circuits integrated within dynamic random access memories (DRAMs). Self-refresh circuits are used to refresh the memory contents of a DRAM when in a powered-down state or otherwise not regularly accessed and refreshed by external circuitry, such as a DRAM controller. The self-refresh circuit integrated within the DRAM includes an oscillator which provides a clock-like signal to control periodic refreshing of the data stored in the DRAM. Proper timing of refresh operations is crucial to accurate retention of stored data. It is therefore desirable that the frequency produced by the self-refresh circuit be relatively independent of variations in the supply voltage applied to the DRAM. However, conventional supply voltage insensitive oscillators have properties which are disadvantageous in DRAM applications—e.g, occupying relatively large portions of semiconductor area. and requiring relatively large currents.

SUMMARY OF THE INVENTION

An oscillator circuit is provided which is adapted to receive a supply voltage. In one embodiment, the oscillator circuit includes a storage unit for storing charge and a control circuit coupled with the storage unit and sensing a charge level. The control circuit produces a control signal of a first state when the charge level has fallen to a first level. The control circuit produces the control signal of a second state when the charge level has risen to a second level. The oscillator circuit also includes a charging circuit which is coupled with the storage unit and with the control circuit. The charging circuit receives the control signal of the first and second states and periodically charges and discharges, respectively, the storage unit in response thereto. The first and second charge levels are such that the storage unit is alternately charged and discharged at a rate that is substantially independent of variations in the supply voltage magnitude.

In another embodiment, the oscillator circuit includes first and second switching circuits, each having an input coupled with a charge storage circuit. The first and second switching circuits switch at first and second voltages, respectively, to which the charge storage unit is charged. The first and second voltages are each a function of the supply voltage. A latching circuit is coupled with the output of each of the first and second switching circuits and produces a control signal having first and second states in response to the switching of the first and second switching circuits, respectively. A charging circuit path is coupled with the charge storage unit and with the latching circuit. The charging circuit path charges the charge storage circuit in response to the control signal of the first state. A discharging circuit path is also coupled with the charge storage unit and with the latching circuit. The discharging circuit path discharges the charge stored circuit in response to the control signal of the second state. Each of the charging and discharging circuit paths presents an impedance such that the switching of the first and second switching circuits occurs at a frequency that is substantially independent of the supply voltage magnitude.

DETAILED DESCRIPTION OF THE INVENTION

In the following description, certain details are set forth in order to provide a thorough understanding of various embodiments of the present invention. It will be clear, however, to one skilled in the art that the present invention may be practiced without these details. In other instances, well-known circuits and/or circuit components have not been shown in detail in order not to unnecessarily obscure the description of the various embodiments of the invention.

Figure 1:
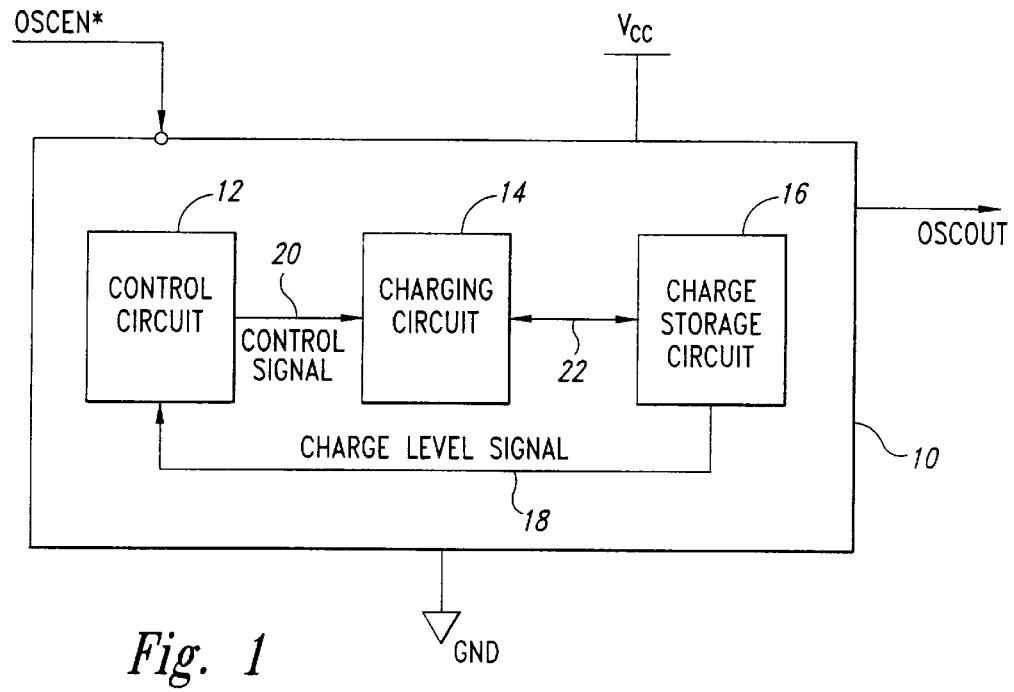
FIG. 1 is a functional block diagram depicting an oscillator circuit according to the present invention.

FIG. 1 depicts an oscillator 10 which is connected to a supply voltage $V_{CC}$ and to ground potential GND. The oscillator 10 is enabled by an asserted signal OSCEN* (the * indicates an asserted logic low or 0 state). When enabled, the oscillator produces a periodically varying output signal OSCOUT. Included within the oscillator 10 are a control circuit 12, a charging circuit 14, and a charge storage circuit 16. The control circuit 12 monitors a charge level signal from the charge storage circuit 16 via a feedback or sense line 18. The control circuit 12 provides a control signal to the charging circuit 14 via a control line 20. In response to the control signal, the charging circuit 14 periodically charges and discharges the charge storage circuit 16 via a charging/discharging line 22.

In operation, the control circuit 12 produces the control signal having a first state when the charge level in the charge storage circuit 16 has fallen to a first level, and the control circuit produces the control signal of a second state when the charge level has risen to a second level. The charging circuit 14 charges the charge storage circuit 16 in response to the control signal of the first state and discharges the charge storage circuit in response to the control signal of the second state. The charge storage circuit 16 may include a capacitor, or other suitable device for storing electric charge, and the control circuit 12 monitors the voltage of the capacitor. The control circuit 12 then produces the first or second state of the control signal in response to sensing a respective one of first and second voltages of the capacitor. The first and second voltages are selected to be functions of the supply voltage $V_{CC}$, such that the frequency with which the charge storage circuit 16 is periodically charged and discharged is essentially independent of the supply voltage, as described in detail below. Correspondingly, the oscillator 10 produces an oscillator output signal OSCOUT having a frequency which is essentially independent of the supply voltage $V_{CC}$.

Those skilled in the art will appreciate that any of a wide variety of circuits may be employed as the charge storage circuit 16. Most generally, any circuit capable of storing electrical energy (e.g., an inductor) may be used. In the general case, sensing a "charge level" more precisely means sensing an energy level, and charging/discharging operations refer to increasing/decreasing stored energy levels, respectively.

Figure 2:
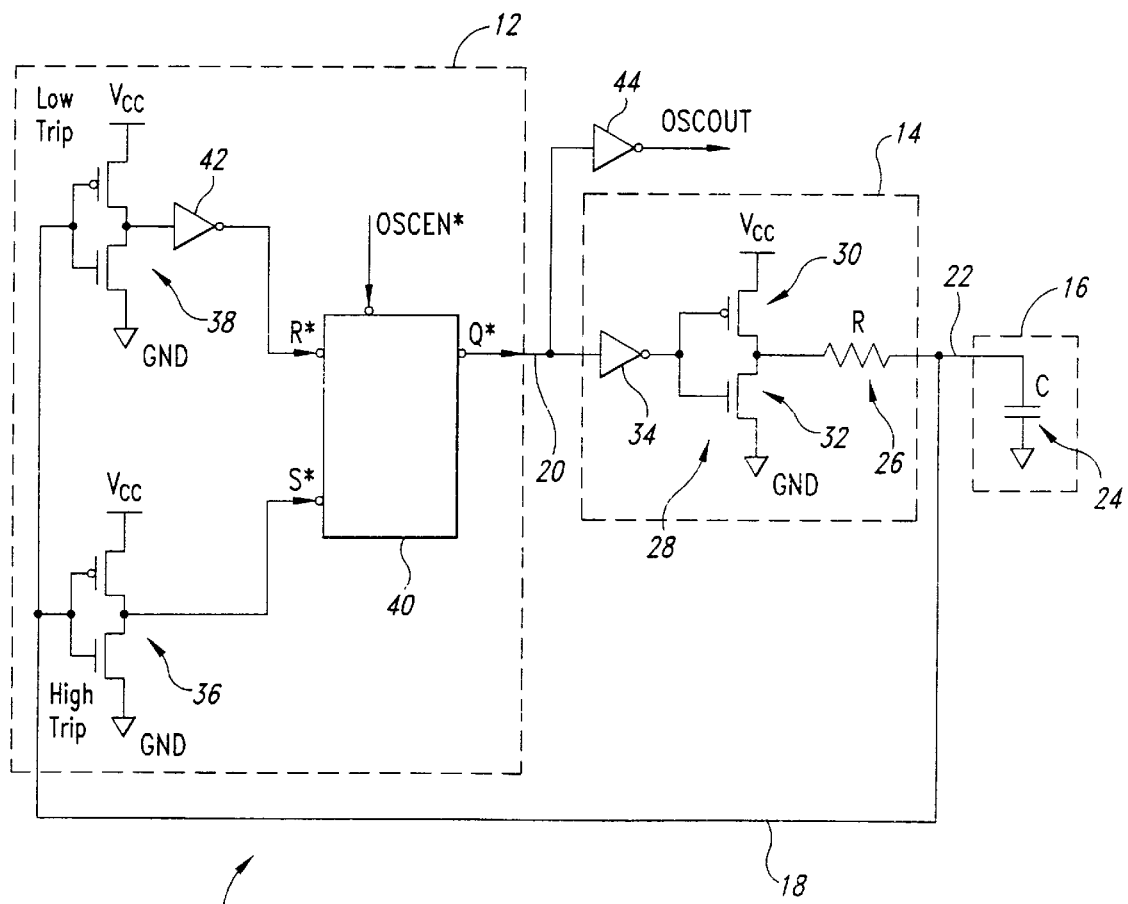
FIG. 2 is a part functional block diagram, part schematic diagram depicting a first embodiment of the oscillator circuit of FIG. 1.

A more detailed understanding of the oscillator 10 of FIG. 1 is provided by the embodiment shown in FIG. 2. The charge storage circuit 16 includes a capacitor 24, and the charging circuit 14 includes a resistor 26 to form an RC circuit. The charging circuit 14 also includes a CMOS inverter 28, having a PMOS transistor 30 and an NMOS transistor 32. The transistor 30 provides a charging path between the supply voltage $V_{CC}$ and the RC circuit, and the transistor 32 provides a discharging path to ground potential GND. The periodic charging and discharging of the capacitor 24 is controlled by the control signal produced by the control circuit 12. An inverter 34 buffers the inverter 28 from the control circuit 12 and inverts the logic state of the control signal produced by the control circuit for application to the inverter 28. If the charging and discharging paths are linear, the time required to charge or discharge the capacitor 24 to any given fraction of the supply voltage $V_{CC}$ is independent of the particular value of $V_{CC}$. The control circuit 12 can then be adapted (as described below) to correspondingly produce the control signal as a function of $V_{CC}$ so that the timing of charging and discharging operations is substantially independent of the particular magnitude of the supply voltage $V_{CC}$.

The control circuit 12 includes a high trip point CMOS inverter 36 and a low trip point CMOS inverter 38. The voltage across the capacitor 24 is applied to the input of each of the inverters 36, 38 by the feedback line 18. The output signal produced by the inverter 36 is provided as a Set signal S* to a bistable circuit, such as flip-flop 40. The output signal of the inverter 38 is inverted by an inverter 42 and provided as a Reset signal R* to the flip-flop 40. The operation of the flip-flop 40 is enabled by the oscillator enable signal OSCEN*, and the flip-flop produces an output signal Q* in response to the Set and Reset signals. The output signal Q* of the flip-flop 40 is the control signal provided by the control circuit 12 to the charging circuit 14. The oscillator output signal OSCOUT is derived from the output signal Q* via a buffer circuit, such as inverter 44, although any of a wide variety of buffers may be employed.

The device parameters of the transistors included in the CMOS inverters 36 and 38 are selected to provide the high trip and low trip characteristics, respectively, of these inverters. For example, the inverter 36 may be designed to switch at a high trip point of $\frac{2}{3}V_{CC}$, and the inverter 38 may be designed to switch at a low trip point of $\frac{1}{3}V_{CC}$. Thus, the high and low trip points are adjusted as a function of $V_{CC}$—namely, fixed fractions of $V_{CC}$. Of course, those skilled in the art understand that real inverters do not trip precisely at the designed fixed fractions of $V_{CC}$, but instead having trip points which are somewhat $V_{CC}$ sensitive. In particular, the high and low trip point inverters 36 and 38 would typically spread a greater fraction of $V_{CC}$ with increasing Vcc magnitude.

Returning to the idealized example, when the voltage across the capacitor 24 falls to a $\frac{1}{3}V_{CC}$ level, the inverter 38 switches to provide a high output signal, which is inverted by the inverter 42 to provide an asserted Reset signal R*. The output signal Q* of the flip-flop 40 is then reset to a logic high state. The inverter 34 then provides a logic low input signal to the CMOS inverter 28, causing the PMOS transistor 30 to turn on, thereby charging the capacitor 24 from the supply voltage $V_{CC}$ through the resistor 26. When the capacitor 24 is charged to a level such that the capacitor voltage rises to $\frac{2}{3}V_{CC}$, the inverter 36 switches to provide an asserted Set signal S* to the flip-flop 40. In response, the output signal Q* is set to a logic low state, which is inverted by inverter 34 to turn on the NMOS transistor 32, thereby discharging the capacitor 24 through the resistor 26 to ground potential GND.

Assuming ideal, linear switching characteristics of the transistors 30 and 32, the time required to periodically charge and discharge the capacitor 24 to fixed fractions of $V_{CC}$ is then determined solely by the approximately constant RC characteristic of the circuit. The oscillator 10 of FIG. 2 would then produce an output signal OSCOUT having a frequency which is independent of the particular value of the supply voltage $V_{CC}$. Of course, the assumed perfect switching characteristics of transistors 30 and 32 do not apply to real transistors. Importantly, the transistors 30 and 32 can significantly impede current flow, depending on their drive characteristics.

Figure 3:
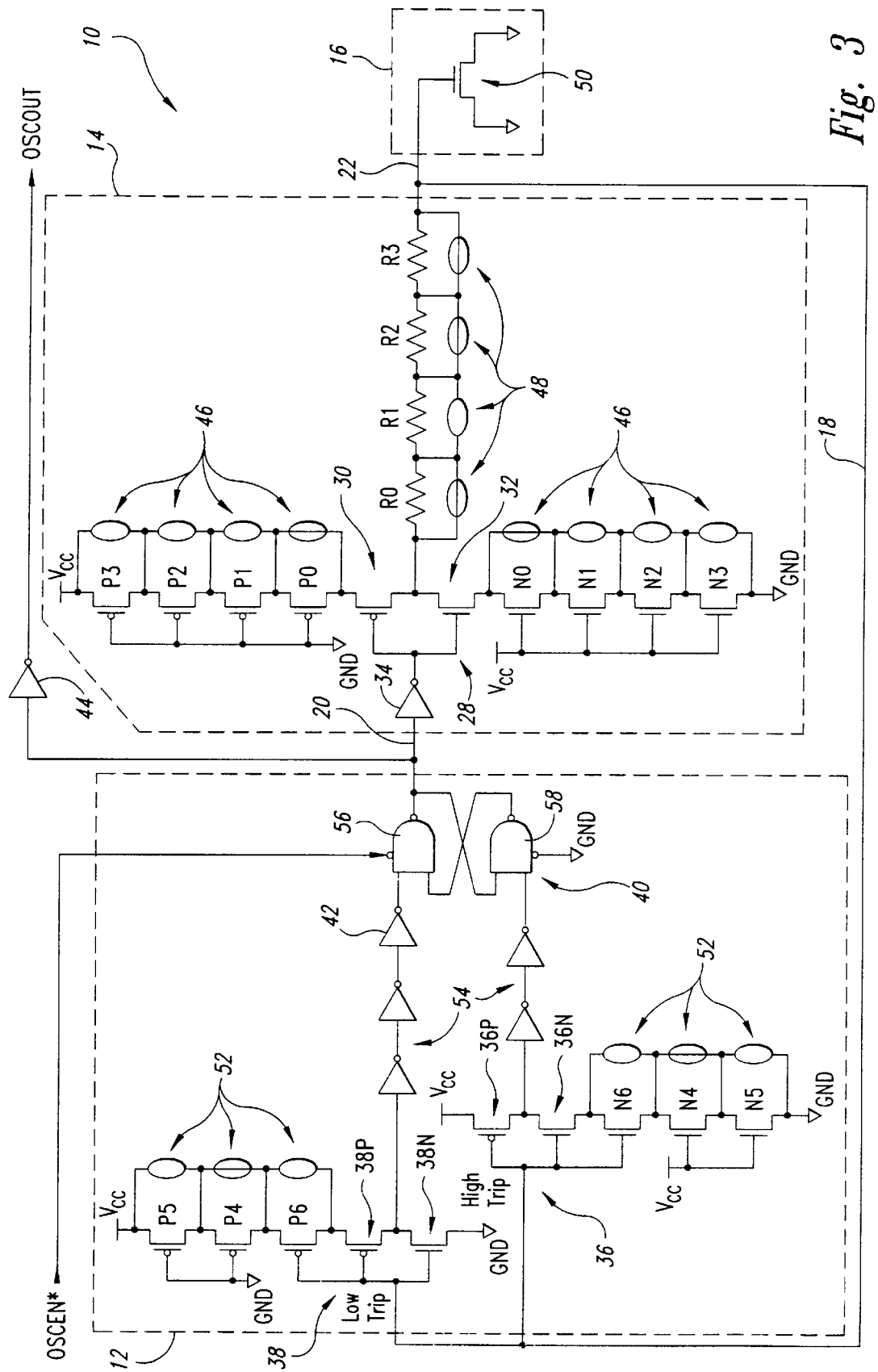
FIG. 3 is a schematic diagram depicting a second embodiment of the oscillator circuit of FIG. 1.

FIG. 3 depicts a second embodiment of the oscillator 10 which provides for counter adjustment to the current impeding effects associated with transistors 30 and 32. In particular, a plurality of PMOS transistors P0–P3 are coupled between the supply voltage $V_{CC}$ and transistor 30. Each of the transistors P0–P3 has its gate tied to ground potential GND and essentially functions as a resistor to limit the current charging the storage circuit 16 through the transistor 30. The resistance of the transistors P0–P3 decreases with increasing $V_{CC}$, thereby compensating for the current limiting effect of transistor 30 and the increased swing in potential of the capacitor 24. Similarly, a plurality of NMOS transistors N0–N3 are coupled between ground potential GND and the transistor 32. Each of the transistors N0–N3 has its gate tied to $V_{CC}$ and essentially functions as a resistor. Again, the resistance of transistors N0–N3 decreases with increasing $V_{CC}$, thereby compensating for the current limiting effect of transistor 32 and the increased swing in potential of the capacitor 24.

Each of the transistors P0–P3 and N0–N3 may be bypassed or shortcircuited by selectable shunting units 46. This provides adjustability of circuit characteristics after completed fabrication of the oscillator 10. The shunting units 46 may be fuses, antifuses, or may themselves be transistors or other suitable selectable/programmable devices. In the particular situation depicted in FIG. 3, transistors P0 and N0 are electrically bypassed by the corresponding shunting units 46. In one embodiment, the transistors P0–P3 have respective width-to-length ratios of 10/30, 10/30, 10/60, and 10/125, and the transistors N0–N3 have respective width-to-length ratios 10/20, 10/40, 10/80, and 10/150.

A plurality of resistors R0–R3 is substituted for the single resistor 26 of FIG. 2. Each of the resistors R0–R3 may be selectively bypassed by a corresponding one of a plurality of shunting units 48 of similar construction to the shunting units 46. In the particular depiction of FIG. 3, only a single resistor R1 is coupled between the inverter 28 and the charge storage circuit 16. The resistors R0–R3 may be made from intrinsic polycrystalline silicon or other suitable resistive material. In one embodiment, the resistors R0–R3 have respective resistance values of 160 kΩ, 80 kΩ, 40 kΩ, and 20 kΩ.

The charge storage circuit 16 depicted in FIG. 3 includes a transistor 50 which is electrically connected in a capacitor configuration. The voltage across the capacitively coupled transistor 50 is applied to the high and low trip point inverters 36 and 38, respectively, via the feedback line 18. A plurality of PMOS transistors P4–P6 are coupled between the supply voltage $V_{CC}$ and the inverter 38. Of these transistors, transistor P6 is selectably includable within the inverter 38, thereby effectively increasing the channel length of the PMOS transistor component of that inverter to further lower the trip point. Transistors P4 and P5 each have their gate tied to ground potential GND and essentially act as resistors. As will be understood by those skilled in the art, the transistors P4 and P5 reduce the drive of P6 and also lower the trip point of the inverter 38 further, thereby providing improved low $V_{CC}$ operation. In one embodiment, the transistors P4 and P5 have respective width-to-length ratios 10/10 and 10/20, and the transistor P6 has width-to-length ratio 10/10. In this embodiment, the PMOS and NMOS component transistors 38P and 38N of the low trip point inverter 38 have respective width-to-length ratios 10/10 and 10/1.5.

A plurality of NMOS transistors N4–N6 are coupled between ground potential GND and the inverter 36. Of these transistors, transistor N6 is selectably includable within the inverter 36, thereby effectively increasing the channel length of the NMOS transistor component of that inverter. The transistors N4 and N5 each have their gate connected to $V_{CC}$ and essentially act as resistors. As will be understood by those skilled in the art, the transistors N4 and N5 reduce the drive of N6 and also raise the trip point of the inverter 36 further, thereby providing improved low $V_{CC}$ operation. In one embodiment, the transistors N4 and N5 have respective width-to-length ratios 10/20 and 10/40, and the transistor N6 has width-to-length ratio 10/20. In this embodiment, the NMOS and PMOS component transistors 36N and 36P of the high trip point inverter 36 have respective width-to-length ratios 10/20 and 10/1.5.

Each of the transistors P4–P6 and N4–N6 is connected to a corresponding one of a plurality of shunting units 52 of construction similar to shunting units 46 and 48. Accordingly, the circuit characteristics can be selectively adjusted after completed fabrication of the oscillator 10. In the particular depiction of FIG. 3, transistors P4 and N4 are short-circuited by the corresponding shunting units 52.

Each of the inverters 36 and 38 are buffered from the flip-flop 40 by a corresponding buffer circuit, such as the paired inverters 54, although any of a wide variety of buffers may be suitably employed. The flip-flop 40 includes two cross-coupled NAND gates 56 and 58. The NAND gate 58 is permanently enabled by virtue of its enable input being tied to ground potential GND. The NAND gate 56 is selectively enabled in response to the asserted oscillator enable signal OSCEN*. The oscillator 10 of FIG. 3 functions essentially as the idealized oscillator of FIG. 2. The transistors P0–P3 and N0–N3 provide a countervailing effect to current impeding effect of transistors 30 and 32, changed potential swing of the capacitor 24, and to $V_{CC}$-sensitive trip points of the inverters 36 and 38. Also, the post-fabrication selectability of transistors P0–P6 and N0–N6, as well as resistors R0–R3, provides precise tuning capability after completed fabrication of the oscillator 10.

Those skilled in the art will appreciate that any of a wide variety of circuits and/or circuit components may be substituted for those described in FIG. 3. For example, inverters 36 and 38 function as electrically controlled switching circuits, which respond to a sensed energy level in the storage circuit 16 to produce switching signals. Similarly, the flip-flop 40 essentially functions as a switch or latching circuit between two different signal states in response to the switching operations of the inverters 36 and 38. Any of a number of wellknown electrically controlled switches could be suitably adapted and substituted for the inverters 36, 38 and the flip-flop 40. Also, the inverter 28 functions as an electrically controlled switch which selectively couples a charging circuit path or a discharging circuit path with the storage circuit 16. Any of a number of wellknown means for switching between circuit paths could be suitably adapted and substituted for the inverter 28.

The charging circuit path includes the resistors R0–R3, the transistors P0–P3, and the transistor 30. The impedance presented by the selected ones of the transistors P0–P3 varies with the supply voltage $V_{CC}$ in such a way as to counteract the variation of the impedance of the transistor 30 with $V_{CC}$. The discharging circuit path includes the resistors R0–R3, the transistors N0–N3, and the transistor 32. The impedance presented by the selected ones of the transistors N0–N3 varies with the supply voltage $V_{CC}$ in such a way as to counteract the variation of the impedance of the transistor 32 with $V_{CC}$. Those skilled in the art will appreciate that any of a number of well-known components whose impedance varies with applied voltage could be adapted and substituted for one or more of the components forming the charging and discharging circuit paths.

Figure 4:
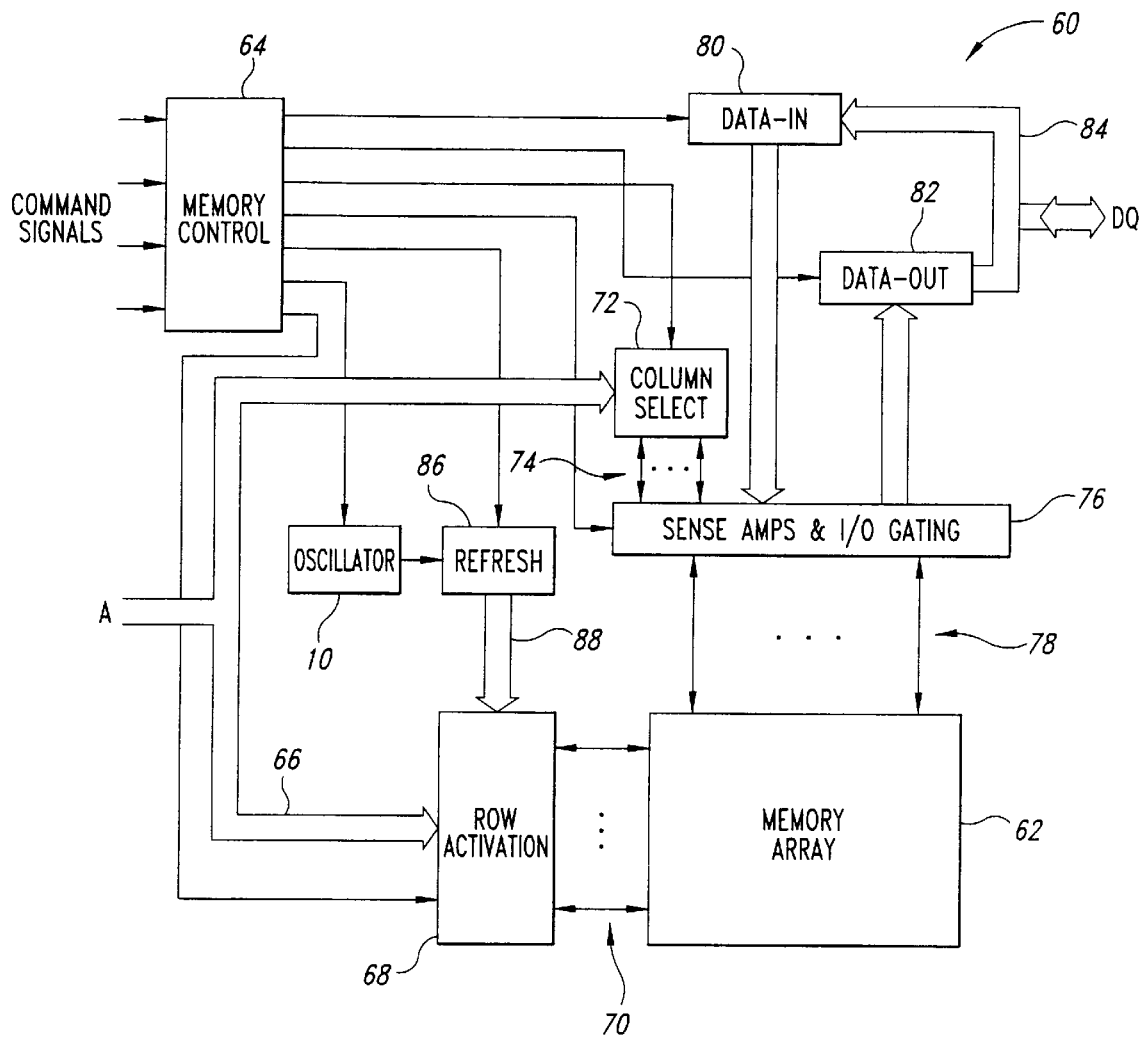
FIG. 4 is a functional block diagram depicting a DRAM which includes the oscillator circuit of FIG. 1.

A particularly important application of the oscillator 10 is shown in FIG. 4. A memory device, such as a DRAM 60, includes a memory array 62 and operates in accordance with a plurality of control signals produced by a memory control circuit 64. The memory control circuit 64 receives a plurality of command signals such as the well-known RAS*, CAS*, WE*, and OE* signals. Additionally, if the DRAM 60 is a synchronous memory device, the command signals may also include a system clock signal, a chip select signal, and a clock enable signal. Those skilled in the art will appreciate that for a synchronous DRAM 60, the memory control circuit 64 decodes the various command signals and correspondingly produces a plurality of control signals to operate the DRAM 60. In the case of an asynchronous DRAM 60, the memory control circuit 64 comprises one or more clock generators triggered by RAS* and the other command signals are typically routed directly to various components within the DRAM 60 in lieu of separately produced control signals.

An address A is applied to the DRAM 60 on an address bus 66. The address A includes a row address and a column address, which are preferably applied to the DRAM 60 sequentially. In response to one or more control signals provided by the memory control circuit 64, row activation circuitry 68 takes the row address, decodes the row address, and activates a selected row of memory cells in the memory array 62 by selecting one of several row access lines 70. In response to one or more control signals provided by the memory control circuit 64, column select circuitry 72 takes the column address, decodes the column address, and selects one of several column access lines 74, each of which is coupled with the memory array 62 by an I/O interface circuit 76. As is known to those skilled in the art, the column select circuit 72 may include an address burst counter and column address multiplexer to provide a sequential burst selection of multiple column access lines 74. In response to one or more control signals provided by the memory control circuit 64, the I/O interface circuit 76 selects the memory cells corresponding to the addressed column location in the activated row via bit lines 78. The I/O interface circuit 76 includes sense amplifiers and I/O gating circuitry. The sense amplifiers determine and amplify the logic state of the selected memory cells, and the I/O gating circuitry receives data from a data-in circuit 80 and sends data to a dataout circuit 82. The data-in and data-out circuits 80 and 82 are connected to a data bus 84 and are used to input and output data D and Q to and from the DRAM 60, all respectively, in response to control signals provided by the memory control circuit 64.

A dynamic random access memory cannot maintain the logic state values of memory cells in the memory array 62 indefinitely. Instead, rows of memory cells must periodically be activated and the logic state of the activated memory cells amplified and restored. This operation is known as a refresh operation. A refresh circuit 86 provides the row activation circuit 68 with the row address of the memory cells to be refreshed via a refresh address bus 88. The refresh circuit 86 regularly increments the row address so that each of the rows of memory cells in the memory array 62 is periodically refreshed. During regular access of the DRAM 60 by external circuitry (such as a DRAM controller), the operation of the refresh circuit 86 is controlled by one or more control signals provided by the memory control circuit 64 in response to a corresponding combination of the command signals provided by the external circuitry. However, refresh operations can be executed—and hence the contents of the memory array maintained—even when the DRAM 60 is not being regularly accessed by external circuitry. In such a case, the DRAM 60 is said to operate in a self-refresh mode and the refresh circuit 86 executes refresh operations in response to a control signal provided by the oscillator 10—the oscillator having been enabled by a control signal produced by the memory control circuit 64 in response to a command issued by the previously accessing external circuitry.

Because the validity of data stored in the memory array 62 depends on frequent and timely refresh operations, the timing of operations by the refresh circuit 86 is quite important. Hence, a high degree of precision is required for the timing of the control signal provided to the refresh circuit 86 by the oscillator 10. It is very desirable that the signal produced by the oscillator 10 have a well-defined and relatively constant frequency in order for valid data to be successfiuly retained in the memory array 62. Those skilled in the art will appreciate that the oscillator 10 described above provides an oscillator output signal OSCOUT whose frequency is relatively independent of the particular supply voltage $V_{CC}$ applied to the oscillator. Those skilled in the art will also appreciate that the oscillator 10 requires less semiconductor area than prior art self-refresh oscillators, thereby improving circuit integration density within the DRAM 60. Those skilled in the art will further appreciate that the oscillator 10 dissipates less current than prior art self-refresh oscillators.

Figure 5:
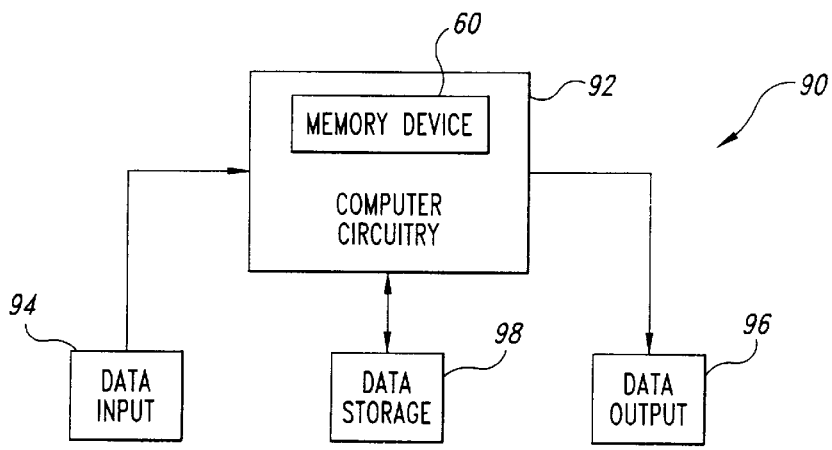
FIG. 5 is a functional block diagram depicting a computer system which includes the DRAM of FIG. 4.

FIG. 5 is a functional block diagram depicting a computer system 90 which includes the memory device 60 shown in FIG. 4. The computer system 90 includes computer circuitry 92 for performing such computer functions as executing software to accomplish desired calculations and tasks. The computer circuitry 92 includes a processor (not shown) and the memory device 60 as shown. A data input device 94 is coupled to the computer circuitry 92 to allow an operator to manually input data thereto. Examples of data input devices 94 include a keyboard and a pointing device. A data output device 96 is coupled to the computer circuitry 92 to provide data generated by the computer circuitry to the operator. Examples of data output devices 96 include a printer and a video display unit. A data storage device 98 is coupled to the computer circuitry 92 to store data and/or retrieve data from external storage media. Examples of storage devices 98 and associated storage media include drives that accept hard and floppy disks, magnetic tape recorders, and compactdisc read-only memory (CD-ROM) drives.

It will be appreciated that, although embodiments of the invention have been described above for purposes of illustration, various modifications may be made without deviating from the spirit and scope of the invention. As discussed above, a number of circuits may be finctionally substituted for those described in the particular embodiments of the invention. Accordingly, the invention is not limited except as by the appended claims.

We claim:

1. An oscillator circuit adapted to receive a supply voltage and operable to provide a periodic oscillator output signal, comprising:

a charge storage circuit;

first and second switching circuits, each having an input coupled with the charge storage circuit and operable to switch at first and second voltages, respectively, to which the charge storage circuit is charged, the first and second voltages each being a function of the supply voltage;

a latching circuit coupled with an output of each of the first and second switching circuits, the latching circuit operable to produce a control signal having first and second states in response to the switching of the first and second switching circuits, respectively; and a charging circuit path and a discharging circuit path, each coupled with the charge storage circuit and with the latching circuit, the charging circuit path operable to charge the charge storage circuit in response to the control signal of the first state and the discharging circuit path operable to discharge the charge storage circuit in response to the control signal of the second state, each of the charging and discharging circuit paths including a voltage controlled resistive element having a resistance which decreases when the supply voltage increases such that the switching of the first and second switching circuits occurs at a frequency substantially independent of the supply voltage.

2. A memory device, comprising:

an array of memory cells arranged in rows and columns and operable to store data;

row address circuitry coupled with the array of memory cells and operable to receive a row address, decode the row address, and activate a corresponding row of memory cells;

refresh control circuitry coupled with the row address circuitry and operable to supply the row address in response to a control signal; and oscillator circuitry coupled with the refresh control circuitry and operable to periodically provide the control signal, and wherein the oscillator circuitry includes:

a capacitor;

first and second inverters, each having an input coupled with the capacitor and operable to switch at first and second voltages, respectively, to which the capacitor is charged, the first and second voltages each being a function of the supply voltage;

a bistable circuit coupled with an output of each of the first and second inverters, the bistable circuit operable to produce a bistable output signal having first and second states in response to the switching of the first and second inverters, respectively;

a charging circuit path and a discharging circuit path each coupled with the capacitor and with the bistable circuit, the charging circuit path operable to charge the capacitor in response to the bistable output signal of the first state and the discharging circuit path operable to discharge the capacitor in response to the bistable output signal of the second state, each of the charging and discharging circuit paths including a voltage controlled resistive element having a resistance which decreases when the supply voltage increases such that the switching of the first and second inverters occurs at a frequency substantially independent of the supply voltage; and a buffer operable to receive the bistable output signal and produce the control signal in response thereto.

3. A computer system, comprising:

a data input device;

a data output device; and computer circuitry coupled with the data input device and the data output device and including a memory device having:

a plurality of memory cells operable to store data;

refresh control circuitry coupled with the memory cells and operable to refresh the data stored in the memory cells in response to a control signal; and oscillator circuitry receiving a supply voltage and coupled with the refresh control circuitry, the oscillator circuitry operable to periodically provide the control signal and including:

a storage unit operable to store charge;

a control circuit coupled with the storage unit and operable to sense a voltage level in the storage unit and to produce the control signal in response thereto, the control signal having a first state when the voltage level in the storage unit has fallen to a first level and the control signal having a second state when the voltage level has risen to a second level; and a charging circuit coupled with the storage unit and with the control circuit, the charging circuit operable to receive the control signal having the first state and to responsively charge the storage unit to the second level, the charging circuit operable to receive the control signal having the second state and to responsively discharge the storage unit to the first level, the first and second levels each being a function of the supply voltage such that the storage unit is alternately charged and discharged at a rate that is substantially independent of variations in the supply voltage, each of the charging and discharging circuits including a voltage controlled resistive element having a resistance which decreases when the supply voltage increases.

4. The computer system of claim 3, further comprising a data storage device coupled with the computer circuitry.

5. In an oscillator circuit adapted to receive a supply voltage, a method of producing a oscillator output signal which is substantially independent of the supply voltage, comprising the steps of:

determining first and second resistance levels as a function of the supply voltage;

determining first and second voltage levels as a function of the supply voltage;

storing charge;

sensing a voltage level of the stored charge;

in response to sensing the first voltage level, producing a first switch signal;

in response to sensing the second voltage level, producing a second switch signal;

latching the first and second switch signals to produce a control signal having first and second states, respectively;

receiving the control signal;

in response to receiving the control signal of the first state, producing a charging current as a function of the first determined resistance, the charging current causing the storage of additional charge;

in response to receiving the control signal of the second state, producing a discharging current as a function of the second determined resistance, the discharging current causing the removal of stored charge; and in response to receiving the control signal of the first and second states, producing first and second states, respectively, of the oscillator output signal.

6. The method of claim 5 wherein the step of determining first and second resistance levels as a function of the supply voltage includes the step of selecting first and second resistance levels having a decreased magnitude when the supply voltage has an increased magnitude.

7. The method of claim 5 wherein the step of receiving the control signal includes the step of buffering the control signal.

* * * * *